Figure 1:
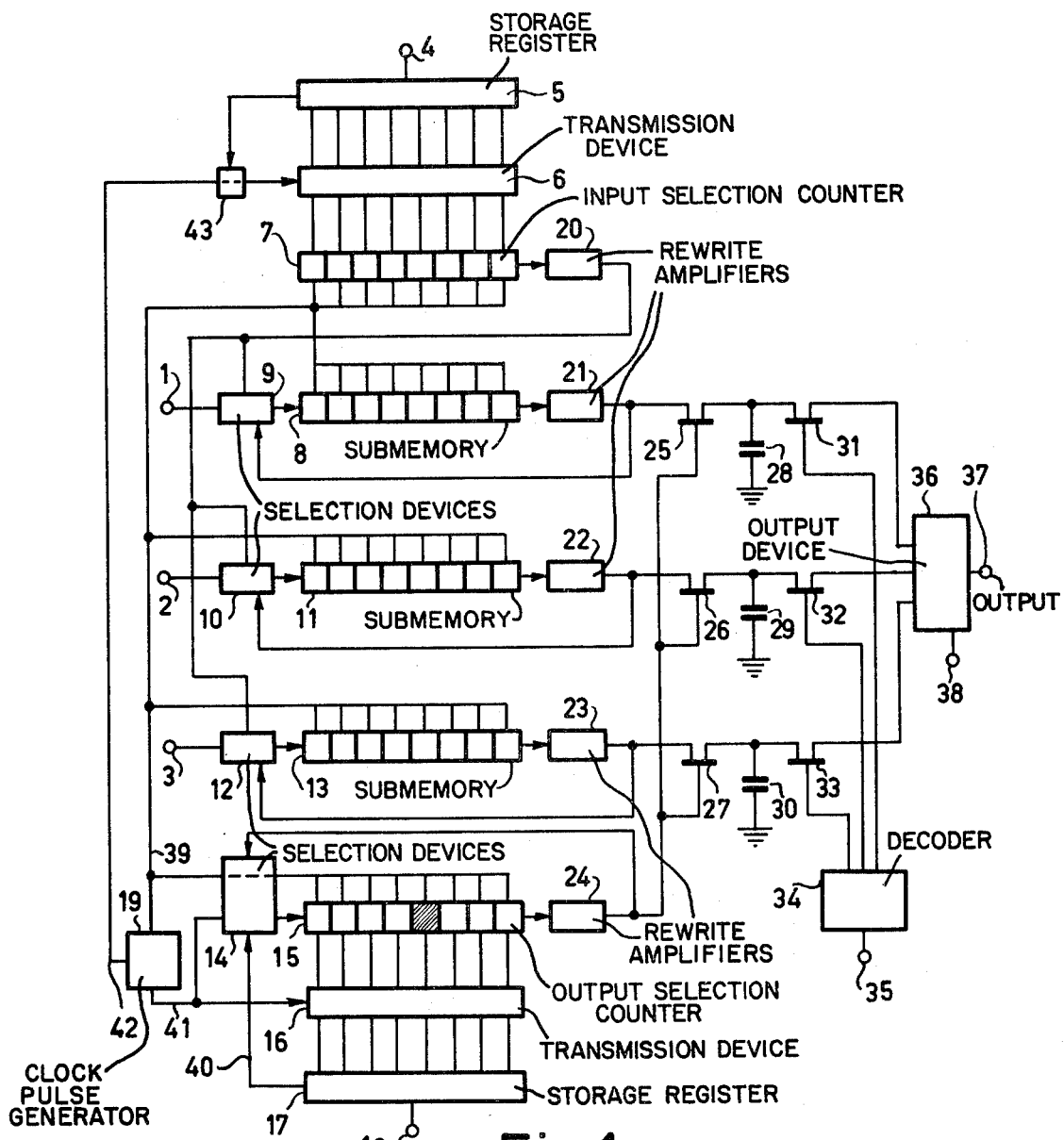

United States Patent [19]

Tromp

[11] 4,101,973
[45] Jul. 18, 1978

[54] RANDOM ACCESS MEMORY WITH VOLATILE DATA STORAGE

[75] Inventor: Hendrik Henricus Maria Tromp, Apeldoorn, Netherlands

[73] Assignee: U.S. Philips Corporation, New York, N.Y.

[21] Appl. No.: 736,856

[22] Filed: Oct. 29, 1976

[30] Foreign Application Priority Data

Nov. 3, 1975 [NL] Netherlands .................. 7512834

[51] Int. Cl.² ............................................. G11C 21/00
[52] U.S. Cl. ....................................... 365/73; 365/76; 365/77
[58] Field of Search .................. 340/173 CH; 365/73, 365/76, 77

[56] References Cited

U.S. PATENT DOCUMENTS 3,763,480 10/1973 Weimer ........................... 340/173 R
3,772,658 11/1973 Sarlo .............................. 340/173 R Primary Examiner—Terrell W. Fears
Attorney, Agent, or Firm—Frank R. Trifari; Steven R. Biren

[57] ABSTRACT

The invention provides a random access memory which consists of a plurality of recirculating sub-memories each having a fixed number of cells for volatile information storage and a further cell, also for volatile information storage, which is connected to the output thereof. The cells may be constructed according to LSI technique. Under the control of a circulating counter, each further cell is connected to an output of a rewrite amplifier which is connected in the recirculating loop of a sub-memory. The information of the further cell is accessible at random by a selection device and is regenerated once per cycle of the sub-memory. Thus, an advantageous compromise is obtained between the features of serially operating memories and random access memories, without an expensive additional buffer being required.

5 Claims, 4 Drawing Figures

RANDOM ACCESS MEMORY WITH VOLATILE DATA STORAGE

The invention relates to a memory, comprising a first number of sub-memories which are coupled end-around each time via a refresh element and each have a second number of cells for volatile information storage serially connected between an input and an output of a sub-memory, furthermore comprising an output device for extracting at least one information element per sub-memory when it appears on the output of the said sub-memory, a selection device which produces a signal adapted for selecting a predetermined sub-memory from the first number in order to present an information element, via the said output device, to an output of the memory, an input device having an input which is connected to an input of the memory and an output which is connected to inputs of the sub-memories in order to store modified information therein, and a clock pulse generator for shifting the information elements serially and repeatedly through the cells under the control of the clock pulses of the clock pulse generator. A memory of this kind is known from U.S. Pat. No. 3,859,640. Cells with volatile information storage of this kind are very well suitable for realization as an integrated circuit. Due to the rewriting, the information elements are restored to their original value. This is necessary because the electrical quantity in which the information elements are embodied is subject to decay. This electrical quantity may be the charge of a capacitor which is slowly depleted. The information elements may be bi- or multi-valent. The decay can also be influenced by the shifting. However, the invention does not relate to the specific technology of the information storage or the nature of the said decay. It is a drawback of memories of this kind that their accessibility is substantially influenced by the nature of the rewrite operation: the sub-memories per se are only serially accessible. If a number of sub-memories are addressed together for a read operation (access), the information of the sub-memories must be arranged either in a shifted manner relative to each other, so that the information successively appears on the outputs of the successive sub-memories, which functionally corresponds to the situation where there is only a single sub-memory, or the information can appear simultaneously, but then intermediate storage of the information elements is required, for example, in the processor memory of the computer whereto the memory is coupled. This is usually impossible, because a very wide data path would then be required. Moreover, in a memory of the kind set forth it is a drawback that the information becomes available only at a given instant, so that at that instant the external connection must be available and/or a choice must already be made between the sub-memories for utilizing only the information thereof. The invention has for its object to provide a memory with at least partial random access of the information elements, i.e. a choice can be made from a number of information elements of the memory, it being possible for the access time to be independent of the rewrite operations. A further object is to realize a memory comprising sub-memories which are coupled end-around in order to achieve a simple organization of the rewriting. Yet a further object is to realize a memory in which the information elements remain exclusively in cells with volatile information storage during storage. The invention achieves these objects in that it is characterized in that per sub-memory at least one first further cell for volatile information storage is connected to an output of the relevant sub-memory in order to receive therein, under the control of a counter position of a first counter comprising a number of counting positions which at least equals the said second number, each time the same information element in refreshed condition, the counter passing through its positions under the control of the clock pulses in synchronism with the shifting of the information elements in the sub-memories, the selection device being connected, by way of a freely activatable 1-out-of-$n$ selector, to outputs of the said further cells. It has been found that the additional cell can be advantageously incorporated in the integrated circuit. Alternatively, cells can be constructed as a single integrated circuit together with all sub-memories. These advantages can be readily realized if the additional cells are constructed according to the same technology as the sub-memories; in many cases only very little space is then required in an integrated circuit. The control can also be effected in an analogous manner. The counter can also be constructed according to the same technology, but a different embodiment sometimes offers advantages.

It is also advantageous for the input device to comprise per sub-memory at least one second further cell for volatile information storage, having an output which is each time connected, via a first switch, to an input of the relevant sub-memory, the said first switch being interconnected under the control of a counter position of a second counter which is advanced in synchronism with the shifting of the information elements, while simultaneously interrupting the end-around coupling via the corresponding rewriting element by way of a second switch which is connected in series therewith in order to feed a sub-memory with modified information. Thus, during the write operation a given degree of random accessibility is achieved, while the newly written information elements mix with the other information elements in the sub-memories without further external control. An attractive organization is achieved when there are a number of memories which consist of sub-memories and which each time contain only a single information element of each memory word. The information is further divided into pages of a number of memory words, while each sub-memory of each memory page contains only a single information element. The number of pages then equals the number of cells per sub-memory. In practice it has been found that in such a memory organization a large number of words of the same memory page must often be addressed in direct succession for a read and/or write operation; in that case the invention offers a simple solution for obtaining faster access.

A second rewrite number is preferably connected in series with the first switch. This results in a simple solution. On the other hand, the first rewrite member can also be used for a write operation by connecting an input thereof to an output of the second further cell.

Preferably, the first and second further cells are embodied in a single cell per sub-memory, a third switch being included between an output of a sub-memory and an input of the associated further cell, at the most one of the first and third switches being operable to conduct under the control of a counter position. As a result of the double use of the further cells, a simplification is obtained. The first and the second counter can then also be advantageously embodied in a single counter.

The invention will be described in detail hereinafter with reference to the figures.

Figure 2:
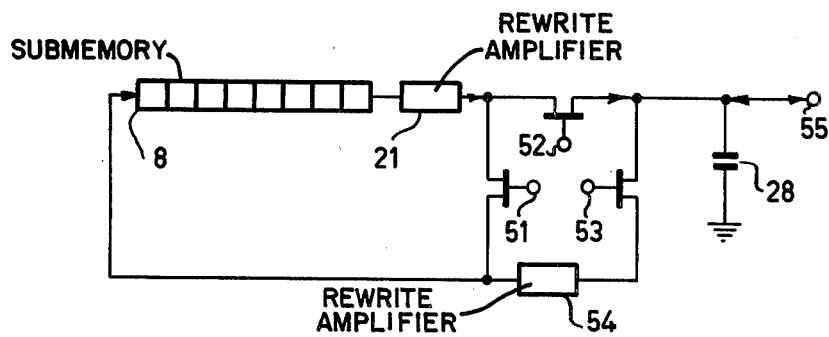
Figure 3:
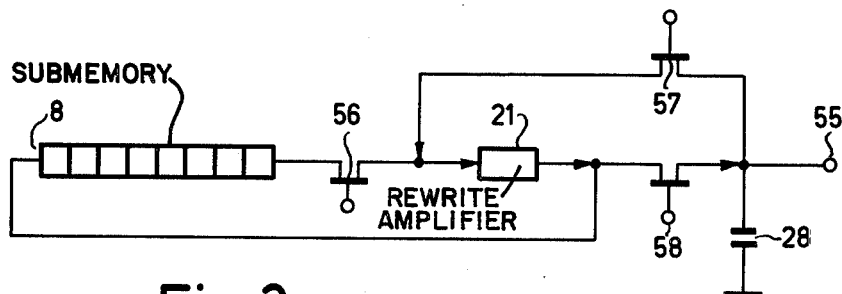
Figure 4:
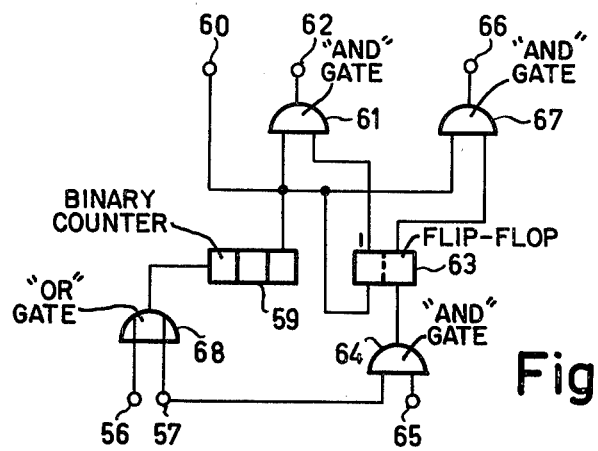

FIG. 1 shows a device in accordance with the invention,

FIGS. 2 and 3 each show an embodiment of a sub-memory in accordance with the invention, with double use of the further cell, and FIG. 4 shows a further embodiment of the counter.

FIG. 1 shows a device in accordance with the invention for storing 24 information elements. The circuit comprises three sub-memories 8, 11, 13, an input selection counter 7, an output selection counter 15, the rewrite amplifiers 20, 21, 22, 23, 24, the selection devices 9, 10, 12, 14, field-effect transistors (switches) 25, 26, 27, 31, 32, 33, capacitors 28, 29, 30, input terminals 1, 2, 3, 4, 18, 35, 38, output terminal 37, clock pulse generator 19, clock pulse lines 39, 41, 42, an output device 36, a decoder 34, transmission devices 6, 16, storage registers 5, 17. The memory is suitable for binary information storage, but the invention is not restricted thereto.

The three sub-memories 8, 11, 13 (eight bits each) comprise, for example, charge-coupled (CCD) cells or other cells for volatile information storage. The invention does not relate to the technology of the cells which, therefore, is not elaborated herein. The device can be extended to suit a substantially larger number of bits. There is also provided an input selection counter 7 and an output selection counter 15 which consist of parts corresponding to those of the elements 8, 11, 13. All cells are driven by clock signals on the central clock pulse line 39, each clock pulse advancing the information each time by one position (this may be a single or a double clock pulse). The last cell of each of the elements 7, 8, 11, 13, 15 is connected respectively to an input of a rewrite amplifier 20, 21, 22, 23, 24 whereby the information is restored to the standard status so that, for example, the binary information "0" and "1" electrically satisfy narrow tolerances. The outputs of the rewrite amplifiers 21 . . . 24 are connected to information inputs of the selection devices 9, 10, 12, 14. If these selection devices are not controlled in a specific manner yet to be described, they conduct the output signals of the latter four rewrite amplifiers, so that the information in the elements 8, 11, 13, 15 continually circulates without the quality of the information stored being reduced by the volatile nature of the information storage. The information thus remains usable in the correct form after a prolonged period of time. Contrary to the elements 7 and 15, the elements 8, 11, 13 may contain an arbitrary succession of information.

One cell of the element 15 contains the information "1", while all its other cells contain the information "0"; this is denoted by the shading of a single cell. An eight-position counter is thus formed. When it appears on the output of the rewrite amplifier 24, the information of the binary "1" acts to make the field-effect transistors 25, 26, 27, otherwise cut-off, conductive for the information then present on the output of the rewrite amplifiers 21, 22, 23, so that this information is stored as an electrical charge in the capacitors 28, 29, 30, respectively, which are not loss-free. The field effect transistors and capacitors are shown as individual elements; it is alternatively advantageous to construct these elements in the same manner as the cells of the elements 7, 8, 11, 13, 15 so that they can also be constructed as an integrated circuit and have the same volatile nature of the information storage and a corresponding period of reliability. In a further embodiment the further cell is constructed according to the same technology as the sub-memories (8, 11, 13), but the reliability period is longer as a result of a different geometrical design. Consequently, the information of the further cell can be derived from its output without regeneration. A longer reliability period usually implies a larger substrate surface area required, but this is not a decisive drawback in the case of a single cell per sub-memory. The replacement by new information can in such a case be solved either because after, for example, two circulations sufficient charge has leaked off anyway, or by applying a specific discharge signal before the recharging. Thus, the single information 1 continuously circulating in the element 15 ensures that the information of the capacitors 28, 29, 30 remains continuously reliable as a result of repeated rewriting. The input terminal 35 can receive an address signal from a user device (not shown), the said signal being decoded in the decoder 34 and serving to make one of the field-effect transistors 31, 32, 33 conductive for the information present as a charge of the capacitors 28, 29, 30. A read control signal from the user device can also reach the terminal 38, so that the output device 36 is activated. This device can operate as an OR-gate which amplifies or not, so that the addressed information appears on the output terminal 37, possibly with an amplitude restored to the standard value or even an increased amplitude; the latter is done, for example, to improve the insusceptibility to subsequent interference signals. Regenerating amplifiers can also be connected in the connection between the further cell and the output device 36. Random access of the information of the capacitors 28, 29, 30 for reading purposes is thus possible. An elaboration of the foregoing consists in the series connection of two additional cells per sub-memory. The element 15 should then also contain two information "1" signals which can be situated adjacently or not.

The terminal 18 can receive further address information, for example, from a computer, so that per sub-memory 8, 11, 13 another information element of the information circulating therein will be stored in the capacitors 28, 29, 30. The arrival of such an address signal causes, for example, via a differentiating detector or under the control of an additional external signal, a blocking signal on the line 40, so that the selection device 14 is blocked. The address information is decoded, in this case into a 1-out-of-8 code. The clock 19 furthermore comprises a divider which dispatches an additional clock pulse via the line 41, for example, after every eight ordinary clock pulses on the line 39, so that the transmission device 16 becomes conductive for the address of the element 17, with the result that this new address is stored in the element 15. Possibly after a small delay, the signal on the line 41 also reaches the selection device 14, with the result that this device is set to the conductive position again. For this purpose the lines 40, 41 are connected, for example, to inputs of a set reset flipflop (not shown) in the selection device 14, an output of which is connected to an input of an AND-gate which is included in the clock pulse line of the element 15, so that it can block the circulatory movement therein; if it blocks, the element 15 is filled exclusively with information "0" at the end of a cycle. As a result of the conductive state of the element 16, this counter is set to a given position again. The fact that the signal on the line 41 appears in each cycle again is not objectionable, because the information of the elements 15 and 17 corresponds exactly at this instant. The reading is thus controlled by address signals on the (possibly multiple) terminals 18, 35 and possibly 38. The information is accessible in a delayed manner per circulating element with a mean delay time of approximately one half circulation cycle, which in this case amounts to four clock pulse periods. The capacitors 28, 29, 30 have random accessibility and perform the function of a buffer store. For example, a "page" of the information can be written in parallel in this buffer store and be read one word after the other. For this purpose there are provided a number of memories in accordance with FIG. 1, each memory containing within a storage word a single information bit which always has the same sequence. In an arrangement comprising memories as shown in FIG. 1, eight pages containing three words per page can be stored. When a new page is fetched to the capacitors 28, 29, 30, it may be necessary to empty, i.e. discharge, these cells by a special signal, for example, a signal which can be received on the terminal 35.

On the terminal 4 address signals can be received for writing, after which the transmission element 43 is set to the conductive position. In the storage register 5 a one-out-of-eight code is formed from the address. Via the line 42, the transmission element 43 receives one clock pulse per complete cycle in the same manner as the transmission device 16 receives a clock pulse via the line 41. If a new address has arrived, the clock pulse is conducted, via the element 43, to the transmission device 6, and moreover, the transmission element 43 is set to the blocking position again, possibly after some delay, for example, by a monostable element contained therein (not shown). Thus, in the element 7 every newly received address is stored exactly once as a 1-out-of-8 code which passes through the element 7 in the same manner as through the elements 8, 11, 13, 15, be it that in this case there is no feedback from the output of the rewrite amplifier 20, so that this output can supply a "1" signal only once per newly received address. This "1" output information is applied to the selection device 9, 10, 12, and causes this device to be conductive for the information to be received on the terminals 1, 2, 3 instead of for the output information of the rewrite amplifiers 21, 22, 23. Thus, the stored information is modified. The output information "0" of the element 7 has no effect. The elements 5 and 17 may possibly be the same, a "read" or "write" signal signal then determining the selective control of the other elements. Further cells for volatile information storage (capacitors 28, 29, 30) may be connected to the input terminals 1, 2, 3, the said further cells then being connected together to the selection devices 9, 10, 12 by field effect transistors of the type 25, 26, 27. These cells can be filled, for example, serially or in arbitrary succession.

FIG. 2 is a further elaboration, and shows a sub-memory in accordance with the invention with double use of the further cells. The circuit comprises the said components 8, 21, 28, a second rewrite amplifier 54, three field-effect transistors 51, 52, 53 and one information terminal 55 on which information (charge) can be received as well as given off, for example, under the control of selectively addressable transistors, the other sides of which are connected to a simplex or duplex information BUS (compare transistors 31, 32, 33 and the terminal 37 of FIG. 1).

The system is controlled by a clock pulse generator and a counter yet to be described. Three situations are possible:

(a) the clock pulse arrives, in the case of a read operation, but the counter does not supply an output carry signal ($\overline{CO}$; the stoke denotes the inverted value). In that case the sub-memory 8 is coupled end-around, because the transistor 51 is conductive ($\overline{CO}$); the two other transistors are cut off.

(b) ditto, but the counter does supply a carry signal (CO). During a read operation, the signal R is high, the signal W (write) is low, so $\overline{W}$ is high. In that case the transistor 51 is conductive again (the + indicates a logic OR-function), like the transistor 52 (the dot indicates a logic AND-function), but the transistor 53 is cut off. A rewrite operation thus takes place in the further cell, symbolically denoted by the capacitor 28, and the restored information is available on the terminal 55 for an entire clock pulse cycle.

(c) in the case of a write operation, the counter supplies a carry signal. In that case only the transistor 53 is conductive and the information of the further cell is applied, via the rewrite amplifier 54, to the sub-memory 8. The transistors 52 and 53 are never simultaneously conductive; also in this case use can again be made of two further cells for loading two bits per sub-memory.

FIG. 3 shows a different solution for the foregoing, involving only a single rewrite emplifier per sub-memory which is further controlled in the same manner by three transistors 56, 57, 58. The conditions for the conductivity of these transistors are indicated in the same way as in FIG. 2.

FIG. 4 shows a further embodiment of a counter. The device comprises a binary counter 59, a flip-flop 63, input terminals 56, 57, 65, output terminals 60, 62, 66 and gates 68, 61, 64, 67. The binary counter 59 comprises three stages and hence eight positions: after eight clock pulses, a carry output signal appears. The clock pulses can be received from the OR-gate 68 which receives the clock pulses on the terminal 57. The terminal 65 carries a bivalent read/write signal, the reading operation being indicated by a bivalent "0". In the case of a read operation, the gate 64 thus supplies a logic "0". When the counter has reached its maximum counting position, the AND-gate 61 receives two logic "1" signals and supplies one logic "1" signal which can thus activate the gates 52 and 68. In the case of a write operation, the terminal 65 receives a brief "1" signal which coincides with one clock pulse, so that the flipflop 63 is set to the position "0". The carry signal of the counter 59 is then allowed to pass by the gate 67 and indicates the signal W·CO which can actuate the gates 53 and 57. By inversion a signal can be formed therefrom which makes the gates 51 and 56 conductive. After a short delay, the carry output signal sets the flip flop 63 to the zero position again (but only after the gate 61 can no longer supply a "1"-signal), so that only one write operation takes place. The gate 61 can be blocked by way of an additional input (not shown) if the writing of a "page" takes much time. The carry signal appears on the terminal 60. On the terminal 56 additional pulses can be received whereby the counter can be advanced in order to change the addressed page position.

What is claimed is:

1. A random access memory, comprising a plurality of sub-memories, each having an input terminal, an output terminal and a plurality of cells for volatile information storage which are serially connected between said input and output terminals of each sub-memory, rewrite means connected to the output terminal of each sub-memory for recirculating and rewriting each said sub-memory output, output means coupled to each said sub-memory for receiving at least one rewritten information element per sub-memory when it appears on the output terminal of said sub-memery, selection means for producing a signal for selecting a predetermined sub-memory in order to supply an information element, from said sub-memory and through said output means, to an output of the random access memory, input means having an input which is connected to an input of the random access memory and an output which is connected to inputs of the sub-memories for storing modified information therein, clock pulse generator means for shifting the information elements serially and repeatedly through the sub-memory cells under the control of the clock pulses of the clock pulse generator means, a counter coupled to said clock pulse generator means, at least one further cell for volatile information storage coupled to the output of each sub-memory in order to receive rewritten information therefrom under the control of a counter position of the counter, said counter having a number of counting positions which at least equals the number of cells in each sub-memory, the counter passing through its counting positions under the control of the clock pulses in synchronism with the shifting of the information elements in the sub-memories, and said selection means being connectable to outputs of said further cells.

2. A random access memory as claimed in claim 1, further comprising a second memory, wherein said input means comprises, per sub-memory, at least one second further cell for volatile information storage, having an output which is connected, by a first switch, to an input of the relevant sub-memory, said first switch being interconnected, under the control of a counter position of said second counter which is advanced in synchronism with the shifting of the information elements, while simultaneously interrupting the recirculating coupling by the corresponding rewrite means by a second switch which is connected in series therewith in order to feed a sub-memory with modified information.

3. A random access memory as claimed in claim 2, wherein a second rewrite means is connected in series with said first switch.

4. A random access memory as claimed in claim 3, wherein said first and second further cells are embodied in a single cell per sub-memory, further comprising a third switch connected between an output of a sub-memory and an input of the associated further cell, at most one of said first and third switches being conductive simultaneously under the control of a counter position.

5. A memory as claimed in claim 2, wherein the said first and second counter are embodied a single counter.

* * * * *